(12) United States Patent
Chen et al.

(10) Patent No.: US 9,134,981 B2
(45) Date of Patent: Sep. 15, 2015

(54) OPENCL COMPILATION

(75) Inventors: Doris Tzu Lang Chen, Toronto (CA); Deshanand Singh, Toronto (CA)

(73) Assignee: Altera Corporation, San Jose, CA (US)

( * ) Notice: Subject to any disclaimer, the term of this patent is extended or adjusted under 35 U.S.C. 154(b) by 317 days.

(21) Appl. No.: 13/531,353

(22) Filed: Jun. 22, 2012

(65) Prior Publication Data

US 2013/0346953 A1 Dec. 26, 2013

(51) Int. Cl.
*G06F 9/44* (2006.01)
*G06F 9/45* (2006.01)
*G06F 17/50* (2006.01)

(52) U.S. Cl.
CPC .............. *G06F 8/48* (2013.01); *G06F 17/5054* (2013.01)

(58) Field of Classification Search
CPC .................................................. G06F 17/5068
USPC ........................................................ 717/151
See application file for complete search history.

(56) References Cited

U.S. PATENT DOCUMENTS

| 7,181,717 | B1 * | 2/2007 | Singh et al. ................... 716/113 |
| 7,634,752 | B2 * | 12/2009 | Iotov et al. .................... 716/138 |
| 7,952,387 | B1 * | 5/2011 | Frazer ............................ 326/38 |
| 8,595,670 | B1 * | 11/2013 | Tse et al. ....................... 716/116 |
| 2002/0066088 | A1 * | 5/2002 | Canut et al. ................... 717/151 |
| 2012/0065956 | A1 * | 3/2012 | Irturk et al. .................... 703/21 |
| 2013/0346953 | A1 * | 12/2013 | Chen et al. .................... 717/151 |

OTHER PUBLICATIONS

Gajski, The Ultimate Reconfigurable Component (2003) Applicant Provided Prior Art ("Gajski").*
D. Gajski, NISC: The Ultimate Reconfigurable Component, TR 03-28, Oct. 1, 2003.
U.S. Appl. No. 13/369,839, filed Feb. 9, 2012, Doris Tzu-Lang Chen.
U.S. Appl. No. 13/369,829, filed Feb. 9, 2012, Doris Tzu-Lang Chen.
OpenCL—The Standard for Parallel Programming of Heterogeneous Systems, Khronos Group, Nov. 2011.

(Continued)

*Primary Examiner* — Don Wong
*Assistant Examiner* — Theodore Hebert
(74) *Attorney, Agent, or Firm* — Fletcher Yoder, P.C.

(57) ABSTRACT

Systems and methods for increasing speed and reducing processing power of a compile process of programmable logic of an integrated circuit (IC) are provided. For example, in one embodiment, a method includes obtaining a high level program, comprising computer-readable instructions for implementation on programmable logic of an integrated circuit (IC); translating the high level program into low level code representative of functional components needed to execute functionalities of the high level program; generating a host program comprising computer-readable instructions for implementing the low level code based upon the high level program; obtaining modifications to the high level program; determining whether the modifications can be implemented by a new host program utilizing the low level code; and generating the new host program to implement the modifications, when the modifications can be implemented by the new host program utilizing the low level code.

20 Claims, 14 Drawing Sheets

(56) References Cited

OTHER PUBLICATIONS

Pekka O Jaskelainen et al: "OpenCL-Based Design Methodology for Application-Specific Processors", Embedded Computer Systems (SAMOS), 2010 International Conference on, IEEE, Piscataway, NJ, USA, Jul. 19, 2010, pp. 223-230.

Kiran Bondalapati et al: "DEFACTO: A Design Environment for Adaptive Computing Technology", In "Parallel and Distributed Processing", Jan. 1, 1999, Springer Berlin Heidelberg, vol. 1586, pp. 570-578.

Joã GBP O M P Cardoso et al: "Specifying Compiler Strategies for FPGA-Based Systems", Field Custom Computing Machines (FCCM), 2012 IEEE, Apr. 29, 2012, pp. 192-199.

Jason Villarreal et al: "Designing Modular Hardware Accelerators in C with ROCCC 2.0", Filed-Programmable Custom Computing Machines (FCCM), 2010 18th IEEE Annual International Symposium on, IEEE, Piscataway, NJ, USA, May 2, 2010, pp. 127-134.

Search Report for European Application 13173146.5 mailed Jul. 3, 2014.

* cited by examiner

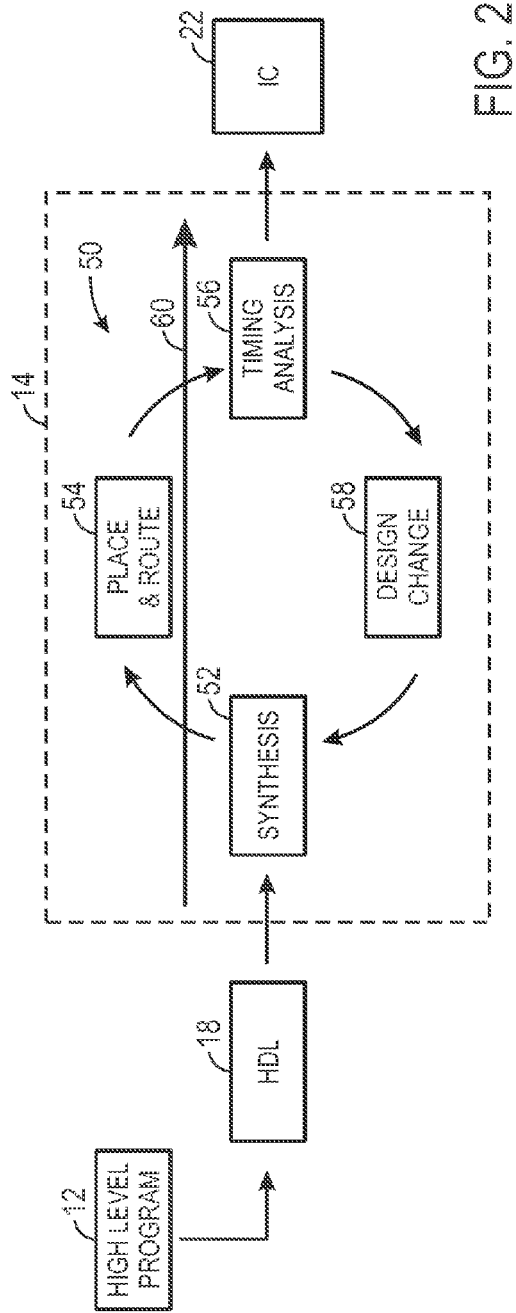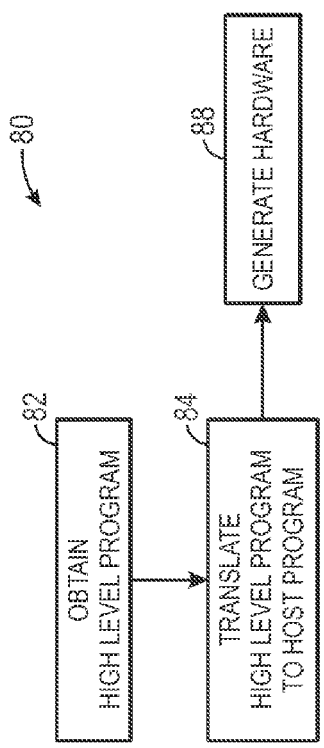

OPENCL COMPILATION

BACKGROUND

The present disclosure relates generally to integrated circuits, such as field programmable gate arrays (FPGAs). More particularly, the present disclosure relates to compilation of programmable logic on in an integrated circuit (e.g., an FPGA).

This section is intended to introduce the reader to various aspects of art. This discussion is believed to be helpful in providing the reader with background information to facilitate a better understanding of the various aspects of the present disclosure. Accordingly, it should be understood that these statements are to be read in this light, and not as admissions of prior art.

Integrated circuits (ICs) take a variety of forms. For instance, field programmable gate arrays (FPGAs) are integrated circuits that are intended as relatively general-purpose devices. FPGAs may include logic that may be programmed (e.g., configured) after manufacturing to provide any desired functionality that the FPGA is designed to support. Thus, FPGAs contain programmable logic, or logic blocks, that may be configured to perform a variety of functions on the FPGAs, according to a designer's design. Additionally, FPGAs may include input/output (I/O) logic, as well as high-speed communication circuitry. For instance, the high-speed communication circuitry may support various communication protocols and may include high-speed transceiver channels through which the FPGA may transmit serial data to and/or receive serial data from circuitry that is external to the FPGA.

In ICs such as FPGAs, the programmable logic is typically configured using low level programming languages such as VHDL or Verilog. Unfortunately, these low level programming languages may provide a low level of abstraction and, thus, may provide a development barrier for programmable logic designers. Higher level programming languages, such as Open CL have become useful for enabling more ease in programmable logic design. The higher level programs are used to generate code corresponding to the low level programming languages. Unfortunately, the conversion from higher level programming languages to low level programming languages oftentimes utilizes a substantial amount of time and processing power. In fact, the compile times for such conversions may oftentimes take many hours or even days to complete, causing a decrease in designer productivity.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Present embodiments relate to systems, methods, and devices for improving the compile time of OpenCL programs through a multi-compile approach. In particular, the present embodiments may provide an Open CL compiler that provides both an initial thorough compile and an incremental compile. The initial compile generates a programming kernel that includes hardware descriptions for the programmable logic of the IC. From time to time, programmable logic designers may implement design changes. When these design changes occur, the compiler, through the incremental compile, may make changes to instructions implemented by the programming kernel without modifying the hardware descriptions, thus rendering the design changes in a far less time than compilation methods requiring generation of the hardware descriptions each time a design change occurs.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present invention alone or in any combination. Again, the brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which:

FIG. 2 is an exemplary block diagram illustrating the time intensive hardware generation cycle of the Open CL compiler;

FIG. 3 is an exemplary flow chart illustrating a process for an initial compile that invokes the hardware generation cycle of FIG. 2, in accordance with an embodiment;

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As discussed in further detail below, embodiments of the present disclosure relate generally to efficient compiling in an Open CL compiler. Traditionally, compilation in an Open CL compiler consists of a time and resource intensive cycle to generate hardware components needed to implement Open CL programs. Unfortunately, this cycle oftentimes takes many hours or even days to complete, causing an unsatisfactory experience for the programmable logic designers compiling high level code into low level instructions on the integrated circuit (IC). Traditionally, every change made to the high level code necessitated an additional time-intensive compile. The techniques discussed herein provide a two-level compile scheme that may provide more time-efficient compilations. The first level, an initial compile, generates a programming kernel that may include hardware descriptions to implement on programmable logic of the IC based upon the high level program provided by the programmable logic designers. The second level, or secondary compile, is useful for subsequent changes made to the high level program. The secondary compile utilizes a modified instruction set that may be implemented on the hardware generated in the initial compile to implement the subsequent changes. By merely modifying the instruction set without modifying the hardware definitions, subsequent compile times may be drastically reduced because the secondary compile may remove the time-intensive step of generating hardware for the programmable logic.

Figure 1:
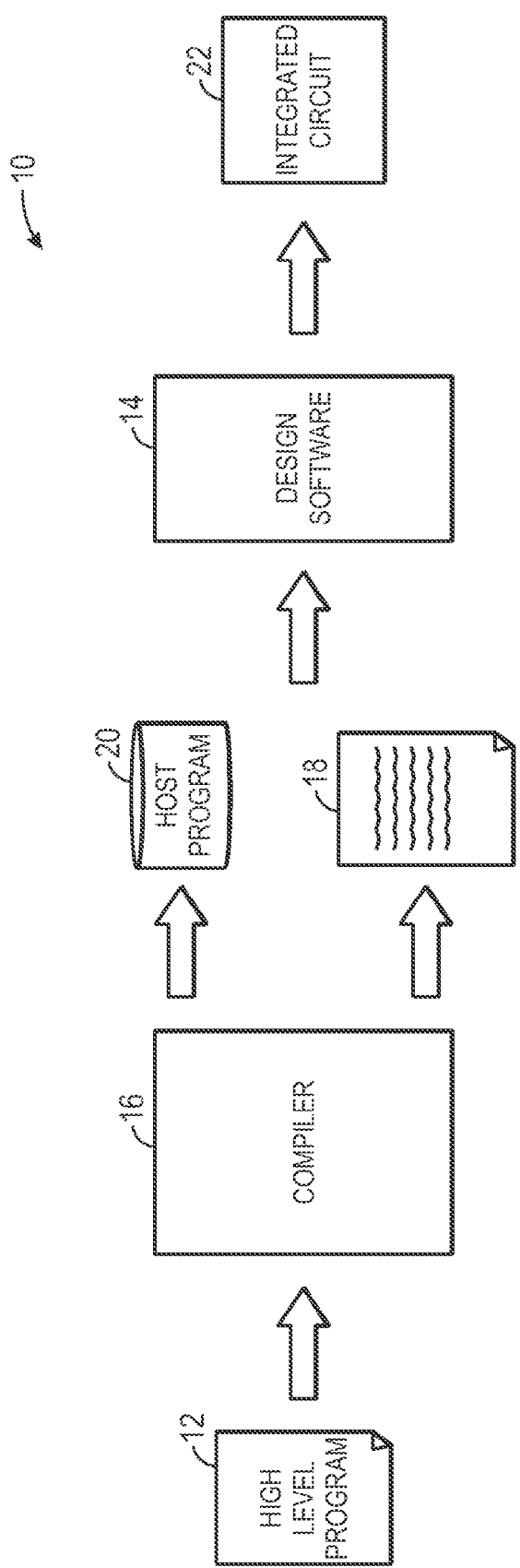
FIG. 1 is an exemplary block diagram of a typical Open CL compile path illustrating a process for propagating programs written in a high level programming languages to low level programmable logic of an IC, in accordance with aspects of the present disclosure.

With the foregoing in mind, FIG. 1 is an exemplary block diagram of an Open CL compile path 10, illustrating the path of a high-level program implemented as low-level code on programmable logic of an integrated circuit (IC), such as a field programmable gate array (FPGA).

As illustrated, the Open CL compile path 10 begins with a high level program 12. The high level program 12 may contain programmable logic implemented by a logic designer. The programmable logic may be computer-readable instructions, written in a high level language, such as an Open CL programming language (e.g., the C++ programming language), which enables the logic designer to more efficiently and easily provide programming instructions to implement a set of programmable logic for an integrated circuit (IC) without a need for low level computer programming skills (e.g., Verilog or VHDL programming skills). Because Open CL is quite similar to other high level programming languages, such as C++, designers of programmable logic familiar with such programming languages may have a reduced learning curve than designers that are required to learn unfamiliar low level programming languages to implement new functionalities into the IC.

However, IC design software 14, such as Quartus II by Altera™, typically operates by using low level code instead of high level programming language instructions. Thus, a compiler 16, such as an OpenCL compiler, may be useful to interpret the high level program 12 to generate an intermediate low level code 18 and/or a host program 20 that provides implementation instructions for the low level code 18. The low level code 18 may be programming code, written in a hardware description language (HDL), such as a Verilog. The low level code 18 may define a grouping of hardware component logic useful for implementing the high level program 12 on the IC. The design software 14 may then interpret the low level code 18 to generate the programmable logic that includes hardware components necessary for implementation of the low level code 18. Once the design software 14, has generated the appropriate programmable logic, the programmable logic is implemented on the IC 22 (e.g., an FPGA).

Unfortunately, as discussed above, the generation of programmable logic that includes a definition of the hardware components necessary for implementation of the low level code 18 is oftentimes a very time-intensive process. In fact, the process may take many hours or days to generate such suitable programmable logic. To provide a more detailed understanding of this time-intensive process, FIG. 2 illustrates an exemplary hardware component generation cycle useful for determining the hardware definition for programmable logic on an IC. As discussed above, the logic designer may implement a high level program 12 that is converted by a compiler into an HDL low level code 18. Design software 14 may interpret the low level code 18 and generate the appropriate programming logic for implementation on the IC 22. To generate the programming logic, the design software 14 may utilize a computation and time intensive timing closure cycle 50. The timing closure cycle 50 may include synthesis 52, placement and routing 54, a timing analysis 56, and/or design change 58. The synthesis 52 includes determining a potential list of hardware components to be implemented on programmable logic of the IC, such that the HDL program may be executed on the IC. During the place and route 54, the design software 14 attempts to efficiently place the hardware components and route signals determined during the synthesis, such that storage and speed of the hardware components is efficient, such that the maximum operating frequency (Fmax) may be increased. During the timing analysis 56, the design software 14 determines if the Fmax for the placed and routed hardware elements and signals provides an Fmax that is within timing parameters specified by a programmable logic designer or the design software 14. If the placed and routed hardware elements and signals do not conform to the timing parameters, and the design software 14 implements a design change 58, modifying the programming logic to include a different set of hardware components. The synthesis 52 is repeated, utilizing a different set of hardware components and/or placement and routing configurations. The timing closure cycle 50 is repeated until the placed and routed hardware components and signals conform to the timing parameters. Unfortunately, the timing closure cycle 50 may need to be repeated numerous times to find an efficient solution to enable execution of the high level program 12, thus creating a large cycle time 60. Because the cycle time 60 may take quite some time, it may cause an unsatisfactory user experience for the programmable logic designer. Further, without the subsequent compile described herein, each time the programmable logic designer modifies the high level program 12, the design software 14 re-executes the time intensive timing closure cycle 50, repeating the time-intensive compile time.

To enhance the user experience, a two-level compile scheme may be implemented. The first-level or initial compile may be useful for generating hardware components to be implemented on the IC and the second-level or secondary compile may be useful for exploiting the hardware components of the initial compile to implement any changes made to the high level program 12 (or the low level code 18). FIGS. 3-8 are provided to more clearly illustrate the initial and secondary compile processes along with various scenarios that may be encountered when utilizing these compile processes.

I. Initial Compile

Figure 4:
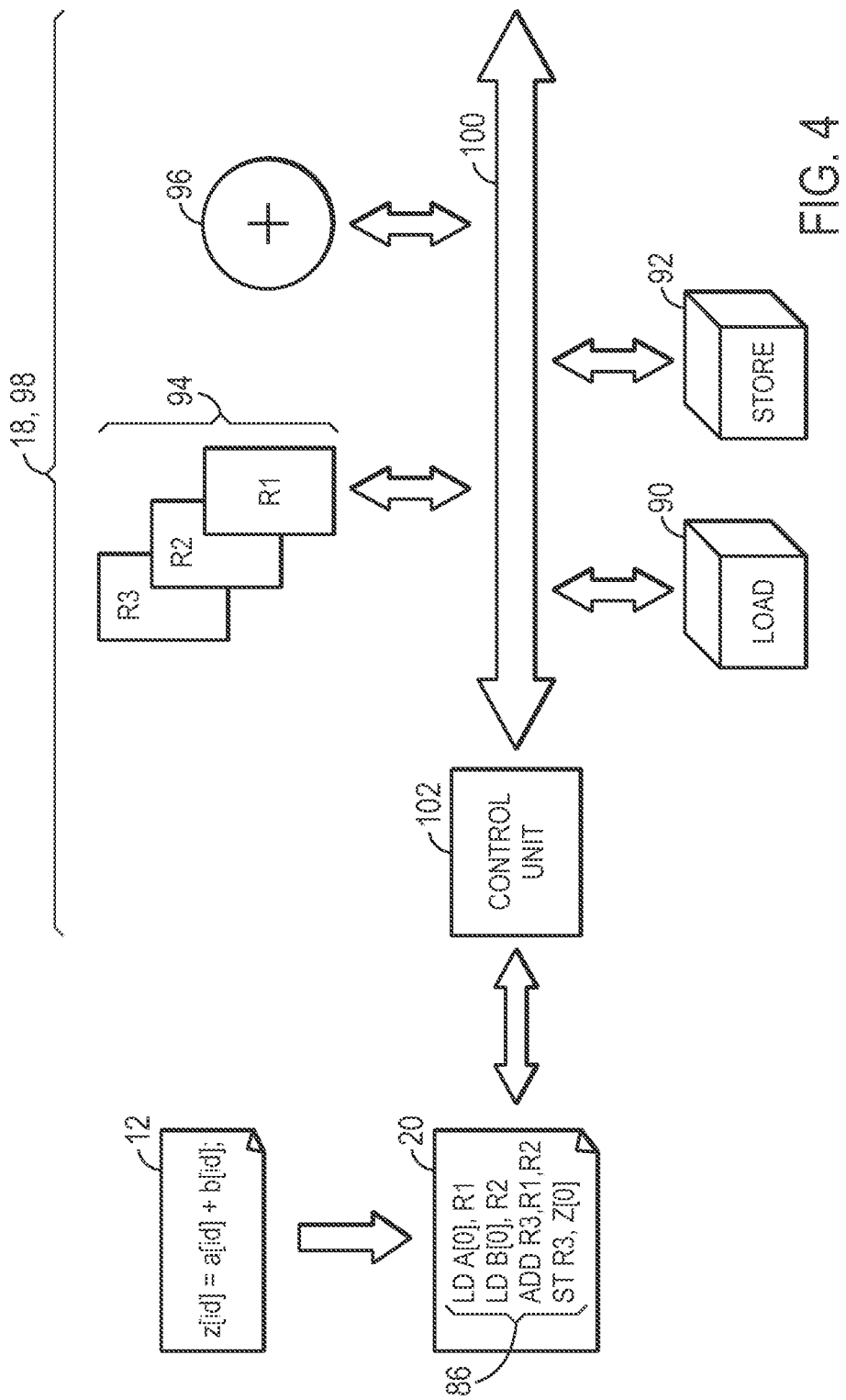
FIG. 4 is an exemplary block diagram illustrating an example of a programming kernel resulting from the initial compile of FIG. 3, in accordance with an embodiment.

As discussed above, the two-level compile scheme may provide an initial compile that generates hardware components useful for implementation of a high level program 14. FIG. 3 is an exemplary flowchart illustrating an initial compile process 80. FIG. 4 is an exemplary block diagram providing an example of an initial compile process 80 for a high level program 12 that includes simple integer math.

As illustrated in FIG. 3, the initial compile 80 may begin by obtaining the high level program 12 (block 82). In the example of FIG. 4, the high level program includes a simple integer addition, storing the sum of a and b in z. The compiler 16 may translate the high level program 12 into a host program 20 (block 84). As illustrated in FIG. 4, the host program 20 may include a low level instruction stream 86 that is a translation from the high level program 12 into a low level host program 20 that may be implemented by the low level code 18. As illustrated, z[id]=a[id]+b[id] translates to load functions that load A[0] and B[0] into registers R1 and R2, respectively. An add function stores the summation of registers R1 and R2 in R3. A store function stores the value in register R3 in Z[0]. After the low level instruction stream 86 is generated, the design software 14 or the compiler 16 may generate the hardware (e.g., the low level code 18) necessary to implement the low level instruction stream 86 (block 88). For example, as illustrated in FIG. 4, because the instruction stream 86 includes load units 90, store units 92, registers 94 (e.g., R1, R2, and R3), and an addition functional unit 96, the hardware definition 98, defined by the low level code 18, includes each of these components generated on a data path 100 for use in the programmable logic of the IC 22. Further, a control unit 102 (e.g., a state machine) may control the data path 100 by instructing the components connected to the data path 100 (e.g., the load units 90 and the store units 92) based upon the low level instruction stream 86, such that the low level instruction stream 86 may be implemented. As will be discussed in more detail below, the hardware definition 98 is not limited to hardware components useful for the implementation of the current low level instruction stream 86. Indeed, as will be discussed in more detail below, the hardware definition 98 may include many components that are not utilized in the programming logic provided to the compiler 16.

In generating the hardware, the initial compile will process the components according to the timing closure cycle 50. Thus, the initial cycle may utilize hours and/or days to complete. However, as will be discussed in more detail below, the initial compile may generate hardware definition 98 that, in an unmodified state, are still useful for certain modifications made to the high level program 12 and/or the low level instruction stream 86 without utilizing an additional initial compile to re-generate the hardware definition 98.

II. Secondary Compile

Figure 5:
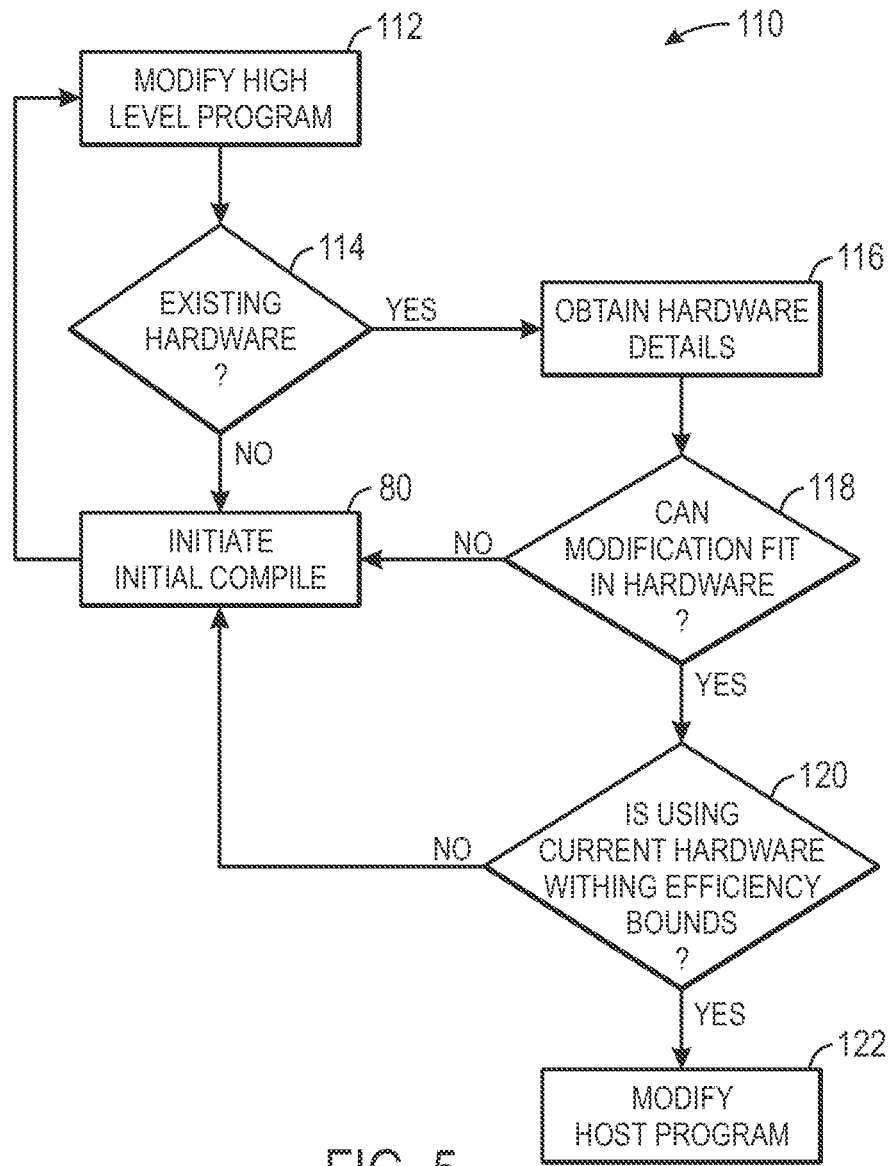
FIG. 5 depicts an exemplary flowchart illustrating a process for a secondary compile that does not invoke the hardware generation cycle of FIG. 2, in accordance with an embodiment of the present disclosure.
Figure 6:
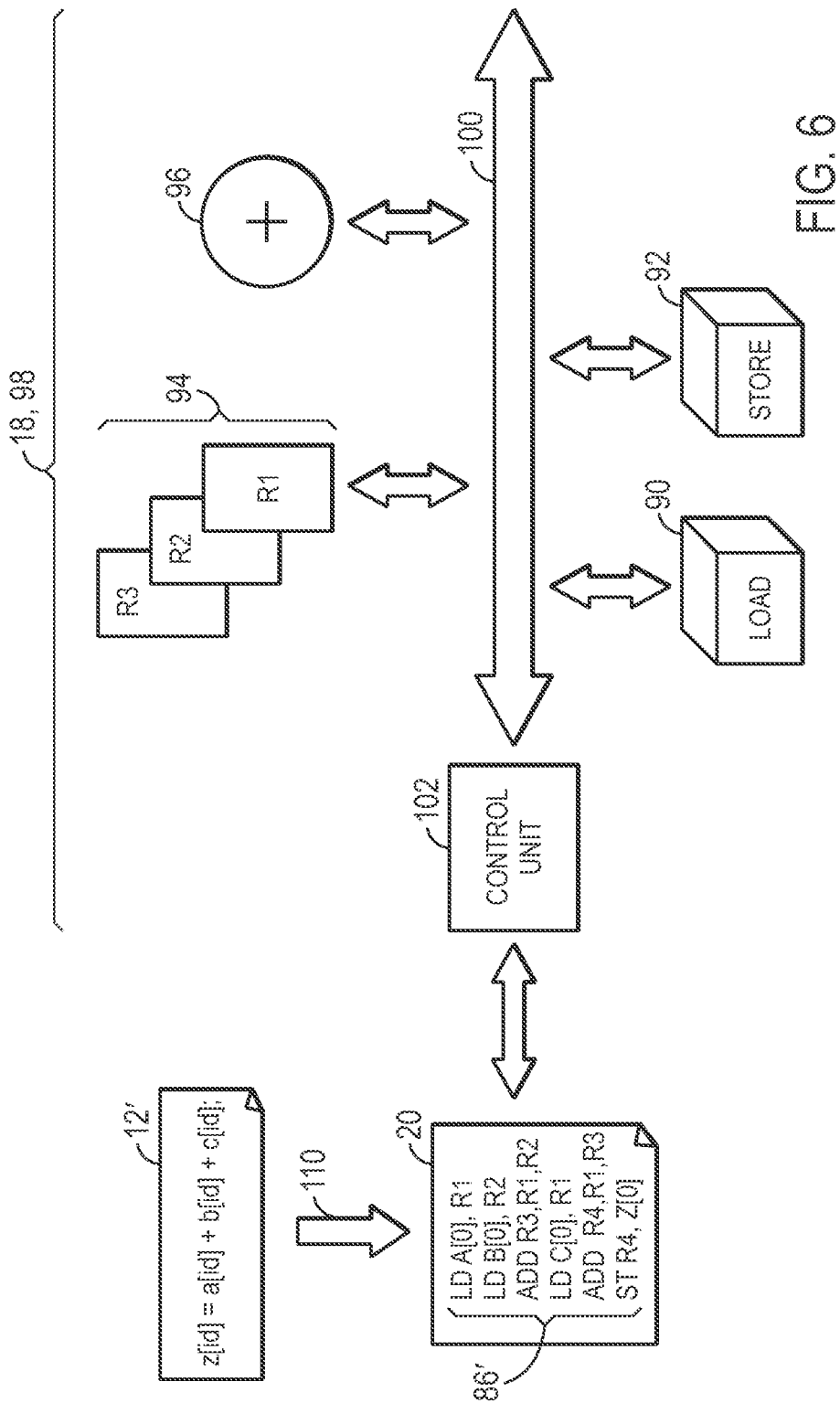
FIG. 6 is an exemplary block diagram illustrating a change to the high level program that invokes a secondary compile, such as the one of FIG. 5, in accordance with an embodiment.
Figure 7:
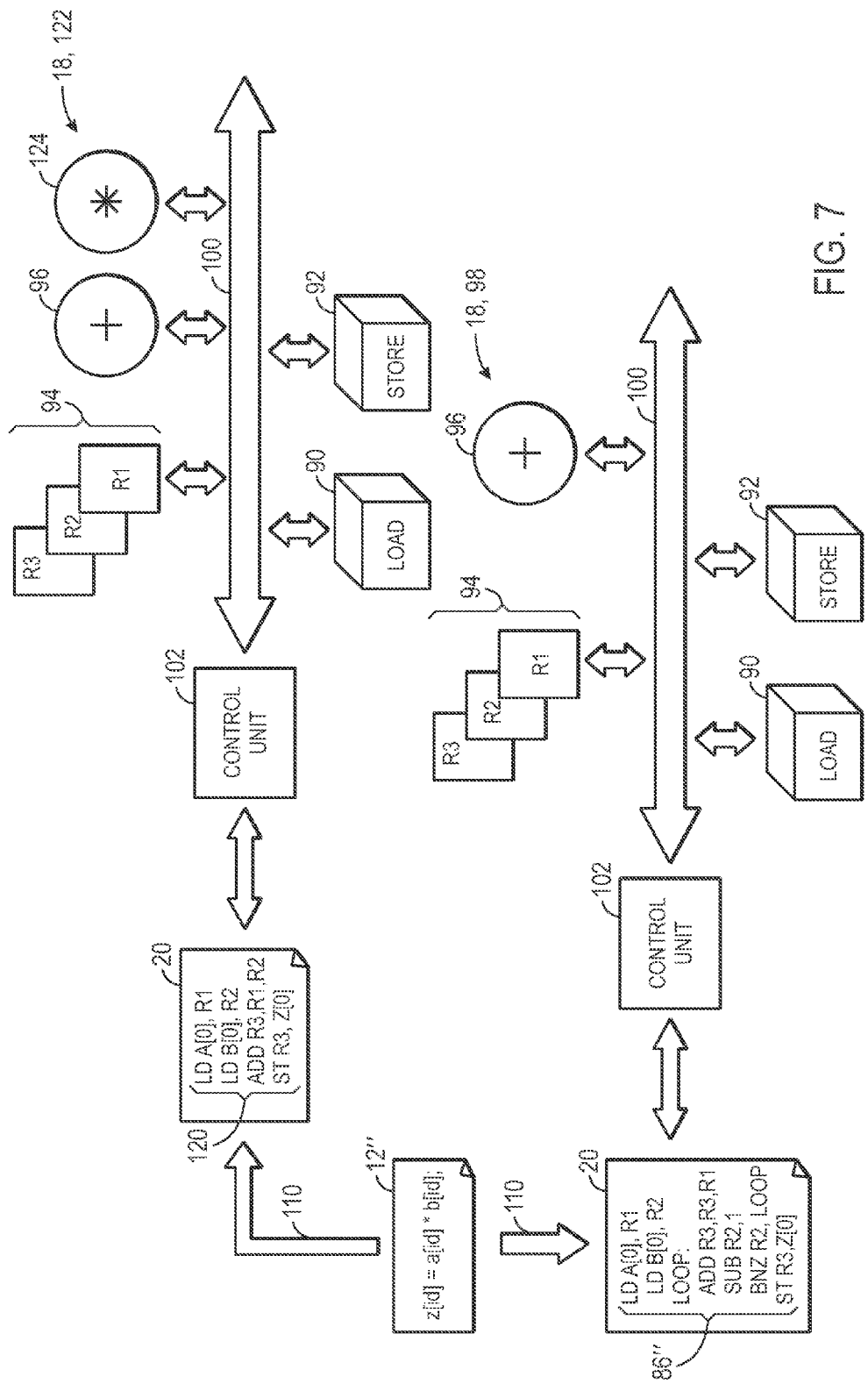
FIG. 7 is an exemplary block diagram illustrating a change to the high level program that necessitates a new initial compile, in accordance with embodiments of the present disclosure.
Figure 8:
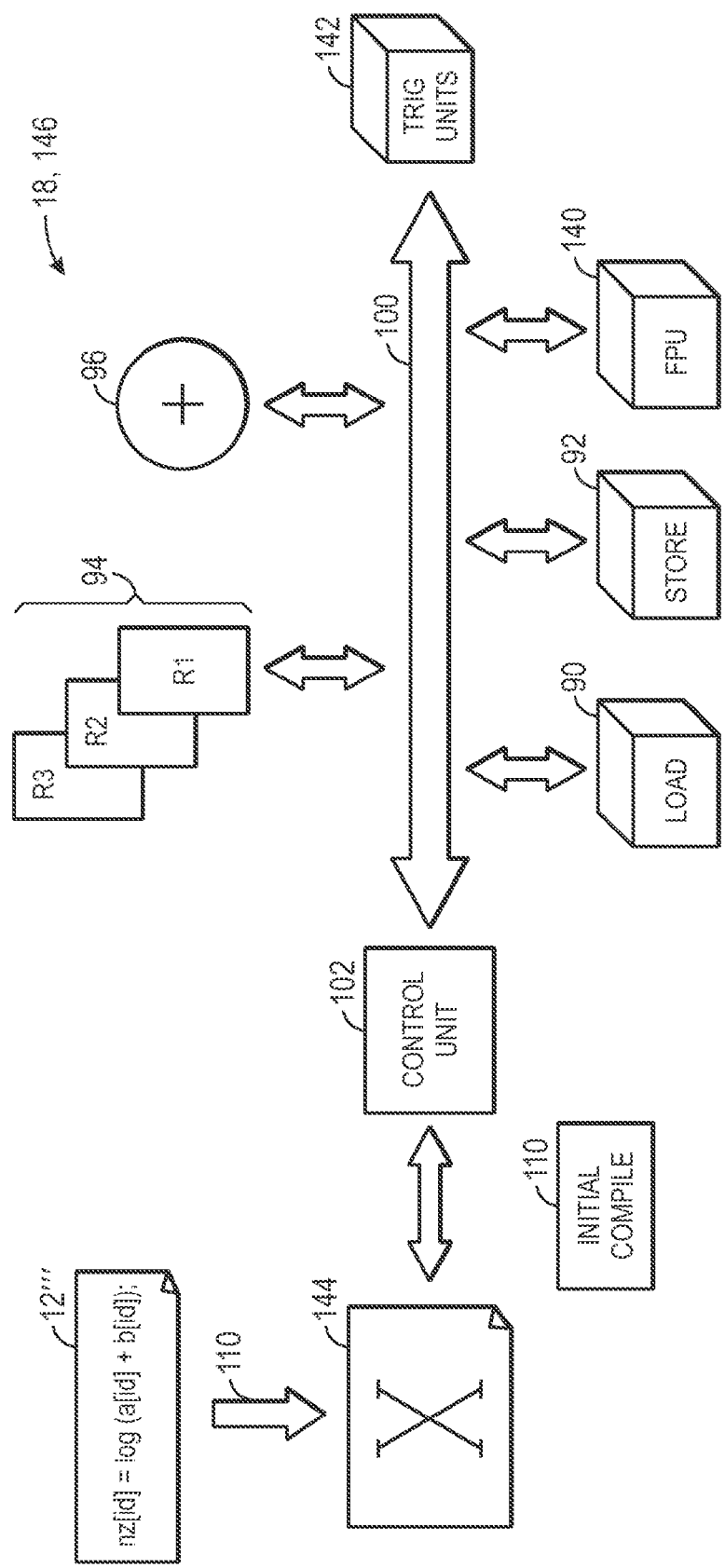
FIG. 8 is an exemplary block diagram illustrating a change to the high level program where a secondary compile may be feasible but may be outside efficiency boundaries when implemented through the secondary compile, in accordance with embodiments of the present disclosure.

The secondary compile may be useful to implement modifications made to the high level program 12 and/or the low level instruction stream 86 without regeneration of hardware components through an initial compile. FIG. 5 illustrates an exemplary secondary compile process 110 and FIGS. 6-8 illustrate various scenarios that may be encountered after the high level program 12 is modified. As illustrated in FIG. 5, the secondary compile process 110 may be initiated when a logic designer modifies the high level program 12 (block 112). A poll is completed to determine whether existing hardware has been generated for the high level program 12 (block 114). In alternative embodiments, the designer may simply choose an option to compile using a secondary compile, such that the design software 14 may safely assume that hardware generation has previously occurred. If no hardware has been generated previously, the initial compile process 80 is executed. However, if a previous hardware generation has occurred, the hardware definition 98 is obtained (block 116). The design software 14 and/or the compiler 16 determines whether the high level program modification may be implemented by the current hardware definition 98 (block 118). When the modification cannot be implemented using the existing hardware definition 98, the initial compile process 80 is executed, generating a new hardware definition 98 based upon the modified high level program 112. However, in certain embodiments, when the current hardware definition 98 is sufficient to implement the modified high level program 112, a secondary poll (block 120) may be implemented. The secondary poll determines whether implementing the modification using the current hardware definition 98 would fit within pre-defined efficiency boundaries set in the design software 14 or elsewhere. For example, in some embodiments, the design software 14 may determine a difference between the throughput of a critical path using the original hardware versus the throughput of a critical path that would result if a full recompile were performed. If the throughput difference is within Fmax noise, then the design software may determine that the efficiency is within efficiency bounds. However, if the different is not within Fmax noise, then the design software may determine that the efficiency is not within the efficiency bounds.

If implementing the modification using the current hardware definition 98 would result in unacceptable efficiency (e.g., as defined by the efficiency boundaries), the initial compile process 80 is initiated, thus generating new hardware components based upon the modified high level program 112. However, when the modifications can be implemented within the efficiency bounds utilizing the same hardware definition 98, the secondary compile ends by modifying the low level instruction stream 86 to implement the modifications on the current hardware definition 98 (block 122).

In some embodiments, rather than automatically progressing to block 122, the designer may be provided a prompt allowing the designer to specify whether the hardware definition 98 should be regenerated through a subsequent initial compile or whether the current hardware should be utilized despite the efficiency of the programmable logic not falling within the efficiency boundaries. Such choice enables the designer to guide the process by selecting a tradeoff of a potentially lengthy compile time or a potentially less efficient design, thus catering to the designer's preferences.

FIG. 6 illustrates an exemplary high level program 12' that includes a simple modification from the high level program 12 of FIG. 4 that may be implemented by the original hardware definition 98 of FIG. 4. As illustrated, in the provided example, the logic designer has modified the original high level program 12 by adding an additional variable c[id] to the summation stored in z[id]. The high level program is translated into a low level instruction stream 86'. As illustrated, the modifications from low level instruction stream 86 to low level instruction stream 86' are fairly minor, utilizing one additional load and one additional addition instruction. Thus, the design software 14 may determine that the modification may be implemented with the current hardware definition 98 and that such implementation would fall within the pre-defined efficiency boundaries. Thus, to implement the change, the implemented low level instruction stream 86 may be modified to incorporate the changes of low level instruction stream 86'. Thus, the modifications of high level program 12' may be implemented without the need for an initial compile 80, thus skipping the time-intensive timing closure cycle 50.

In some instances, modifications made to the high level program 12 may be implemented using the current hardware definition 98, but such implementation may be unacceptable due to inefficiency of the prescribed implementation. For example, FIG. 7 illustrates an exemplary high level program 12" that provides a more complex low level instruction stream 86" than the low level instruction stream 86' of FIG. 6. In the provided example, the designer has modified the high level program 12 to multiple instead of sum a[id] and b[id]. As illustrated in FIG. 4, the current hardware definition 98 does not include a multiplication functional unit. However, through the secondary compile process 110, the design software 14 may recognize an alternative set of low level instructions that may be implemented using the current hardware definition 98. For example, as illustrated, the low level instruction stream 86" includes an addition loop, used as a substitution for a multiplication functional unit. Thus, the modification may be implemented without change to the current hardware definition 98.

However, the loop may add significant inefficiency to the implementation or the pre-defined efficiency bounds may be strict, and thus the implementation may not fall within pre-defined efficiency boundaries. Thus, an initial compile process 80 may be executed, such that a new low level instruction stream 120 with a new hardware definition 122 having a multiplication functional unit 124 are implemented. By generating a new low level instruction stream 120 and the new hardware definition 122, the programmable logic may be more efficient and conform to the efficiencies standards.

In certain situations, the current hardware definition 98 cannot implement the modifications to the high level program 12 made by the logic designer. FIG. 8 provides one such example. As illustrated, the high level program 12 has been modified to a high level program 12''' that uses a logarithm function, and thus utilizes floating point functional units 140 as well as trigonometry functional units 142. Because the current hardware definition 98 does not include floating point functional units 140 or trigonometry units 142, the design software cannot translate the high level program 12''' into a low level instruction stream that may be implemented by the current hardware definition 98 (as is illustrated by the void low level instruction stream 144). Thus, a full initial compile 110 is initiated, generating the hardware definition 146 that includes the floating point units 140 and the trigonometry units 142.

As illustrated by the examples provided by FIGS. 6-8, hardware generation may be avoided when modifying a high level program 12 if a secondary compile can be used to create an implementation using the existing hardware definition and the implementation falls within acceptable efficiency boundaries. Keeping this in mind, it may be beneficial to incorporate additional considerations when completing an initial compile, such that the number of initial compiles needed for modifications to the high level program 12 may be reduced.

III. Compile Considerations and Efficiency Enhancements

Many considerations and efficiencies may increase the Fmax of a resultant implementation and/or reduce the number of initial compiles that a programmable logic designer may encounter. For example, the length and/or complexity of the data path 100 may directly impact the throughput, and thus the Fmax, of an implementation. Further, the number of available programming kernels may affect the throughput of the implementation. Also, by adding flexibility to the kernels and/or enabling the selective initial compilation of specific kernels, the number and/or time length of the initial compiles may be greatly reduced. The compiler 16 may take into account these considerations when deciding how to generate hardware and implement the high level program 12.

i. Data Path Trade-Offs

Figure 9:
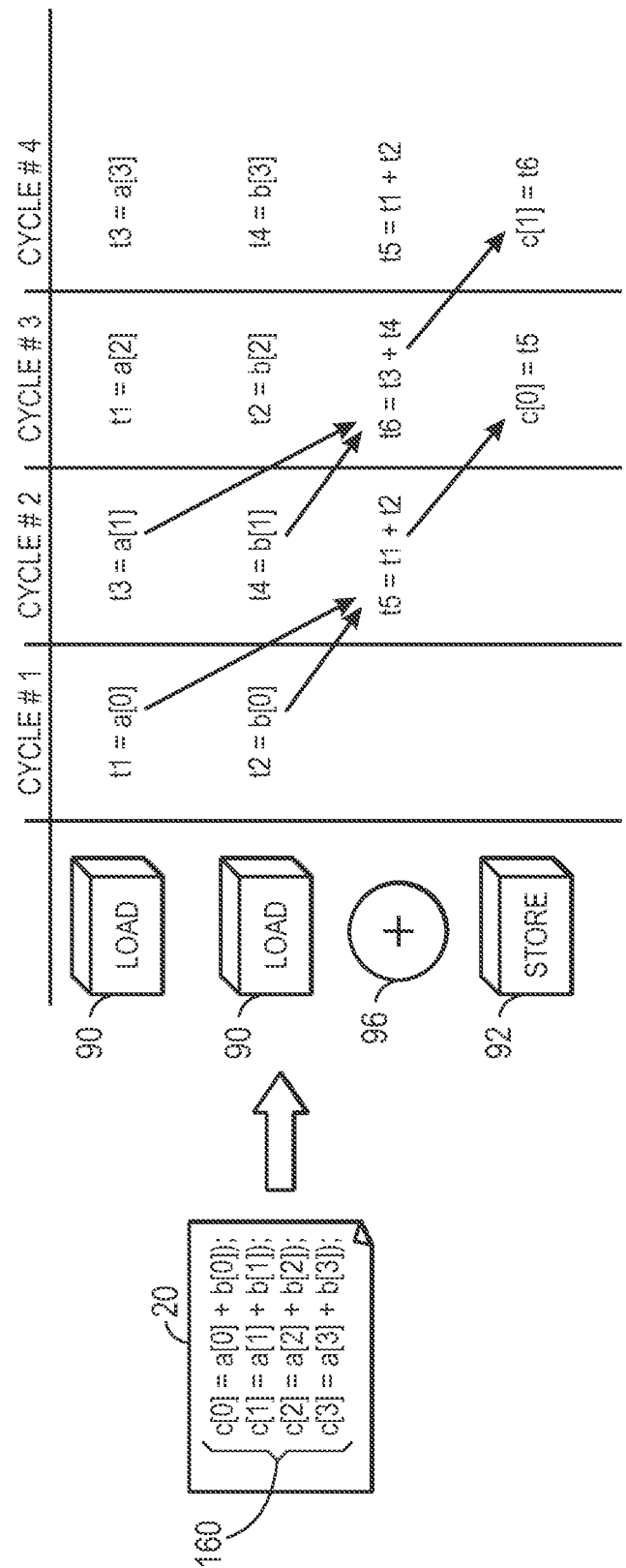
FIG. 9 is an exemplary block diagram illustrating multiple OpenCL threads executed in parallel, in accordance with embodiments.

OpenCL enables more ease in the execution of instructions in parallel, thus increasing programmable logic efficiency. For example, FIG. 9 illustrates multiple OpenCL threads 160 (e.g., instructions in a high level program 12) that may be executed in parallel. As illustrated, the OpenCL threads 160 include multiple summation computational threads. As previously discussed with regards to FIG. 4, addition threads may be implemented through use of load units 90, store units 92, and addition functional unit 96. As illustrated in the example of FIG. 9, in a first clock cycle, the load units may load a[0] and b[0]. In the second clock cycle, the addition functional unit 96 may be used to sum the loaded values a[0] and b[0] and the second thread may be initiated, loading a[1] and b[1]. In the third clock cycle, the summation of a[0] and b[0] may be stored in c[0], completing the execution of the first thread. Additionally, the values loaded in the previous cycle may be added using the addition functional unit 96. Further, values a[2] and b[2] may be loaded by the load units 96, thus initiating the third thread. In the fourth cycle, the summation of the third cycle is stored in c[1], thus completing the second thread of execution. Further, the loaded values from the third cycle are added by the addition functional unit 96 and values a[3] and b[3] are loaded by the load units 90, thus initiating the fourth thread. This cycle may continue, until each of the threads have been executed to completion. As may be seen by this example, parallel execution may provide great efficiency by keeping the maximum number of functional units busy at every clock cycle. Thus, the compiler may include considerations to efficiently ensure that threads may be executed in parallel.

Figure 10:
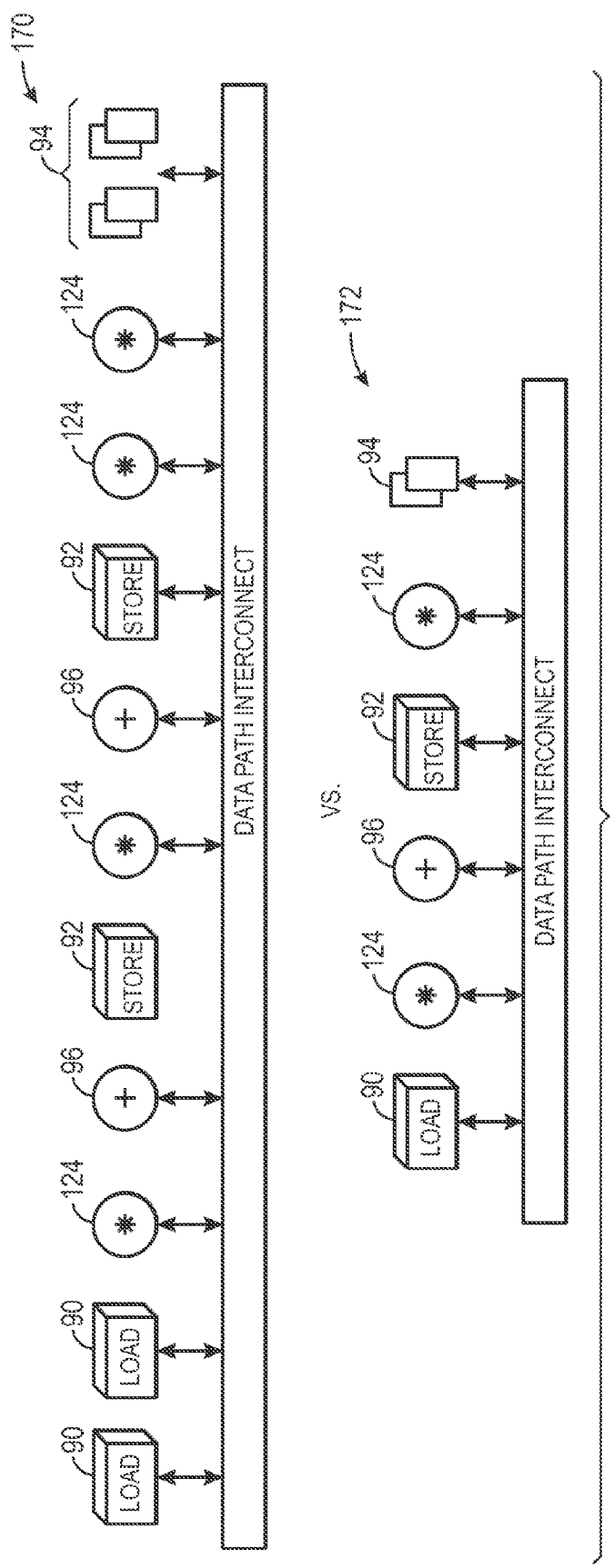
FIG. 10 is an exemplary block diagram illustrating a comparison between complex and more simplistic hardware definitions defined by the initial compile, in accordance with embodiments.

The size of the data path may directly affect the throughput of an implemented thread. While the data path may be minimized by incorporating only one functional unit for each fundamental operation of a thread, under certain situations, it may be beneficial to add additional functional units to the data path. FIG. 10 illustrates an exemplary comparison of two example data paths 170 and 172. Data path 170 is a complex data path with numerous functional units, whereas data path 172 is a more simplistic data path with a reduced number of functional units. For example, complex data path 170 includes twice as many load units 90, store units 92, registers 94, addition functional units 96, and multiplication functional units 124 as the more simplistic data path 172. There are pros and cons to implementing complex data paths 170 versus more simplistic data paths 172. Depending on specific priorities, either may be chosen over the other. For example, there may be two over-arching goals to consider when determining the complexity of the data path. First, complex data paths 170 may be more efficient by providing an ability to execute threads in the fewest cycles possible, while supporting many overlapping parallel threads. For example, due to the increased number of functional units, many threads of computation may be added in parallel without the data path becoming saturated. Thus, there may be increased efficiency for a high number of threads in the high level program 12. However, a second goal in selecting an appropriate data path is to reduce the area consumed in the programmable logic of the IC. As optional functional units are added to the data path, the amount of area needed to store the data path may grow quadratically. However, such a data path may enable more threads 106 to be added without saturating the data path, thus generating more throughput. Less complex data paths may be duplicated to increase throughput within the system. With the foregoing in mind, the compiler 16 may analyze the tradeoff between the area consumed by the programmable logic and the computation throughput to determine whether a complex data path 170 or a more simplistic data path 172 should be used.

In some instances, the compiler 16 may use the evaluation equation:

$$\frac{\text{cycles per thread}}{\text{area} \cdot \text{the number of parallel threads}}$$

to evaluate the efficiency of the data path size. For example, the compiler 16 may start with the complex data path 172 and evaluate using the evaluation algorithm. The compiler 16 may iteratively remove one or more functional units (e.g., a multiplication functional unit 124) and re-evaluate using the evaluation equation and record the evaluation results. Thus, the compiler 16 may determine the solution with the best balanced results and implement the corresponding data path size.

ii. Multi-Kernel Optimization

Figure 11:
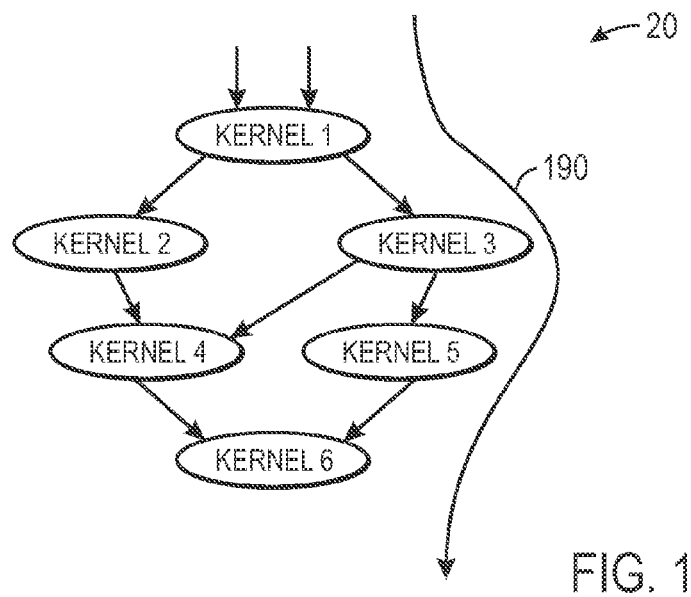
FIG. 11 is an exemplary call graph illustrating a host program 20 that utilizes multiple kernels in its execution flow.
Figure 12:
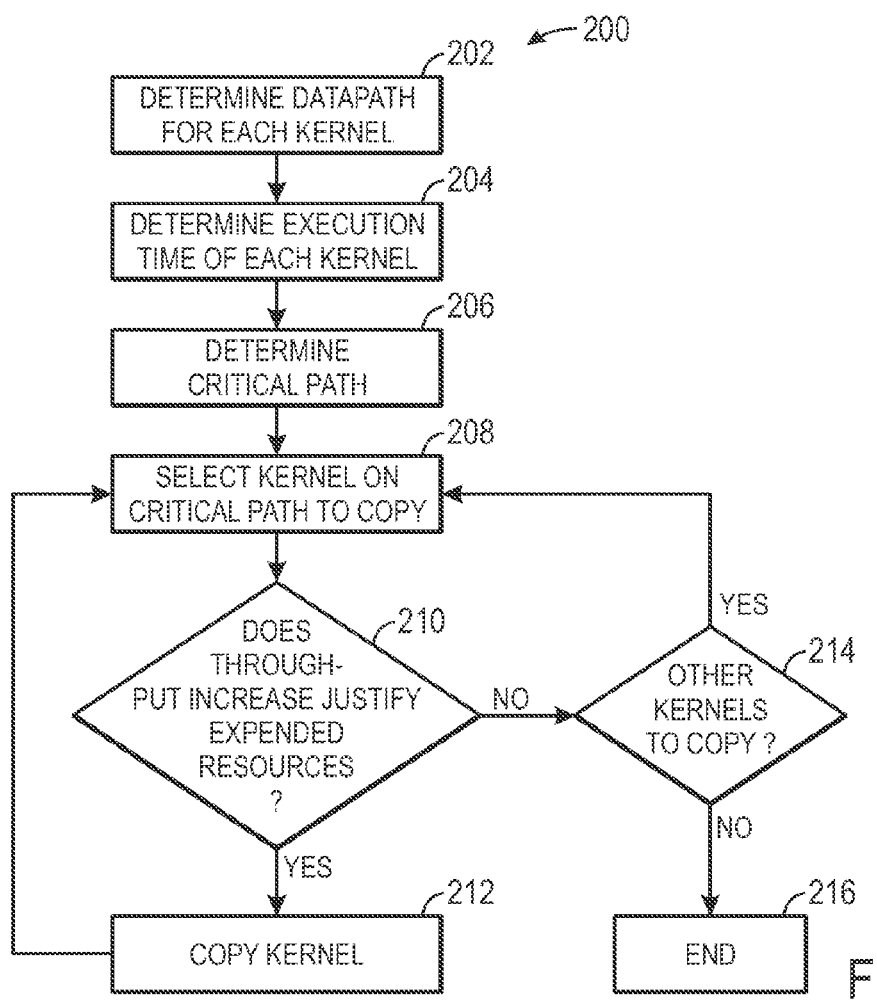
FIG. 12 is an exemplary flow chart illustrating a process for increasing the efficiency of a critical path, in accordance with an embodiment.

Having now discussed optimization of the data path and low level instruction stream for a single Open CL kernel, the discussion now turns to a consideration of a multi-kernel program implementation. FIG. 11 is an exemplary call graph illustrating a host program 20 that utilizes multiple kernels in its execution. As illustrated, the host program 20 may define a call path of the multiple kernels. Line 190 represents the critical path (e.g., the most time-intensive path) called by the host program 20. Because the critical path 190 is the most time-intensive path called by the host program 20, providing added efficiency to the critical path 190 may likely have more impact to overall performance than increasing the efficiency of other call paths. FIG. 12 is an exemplary flow chart illustrating a process 200 for increasing the efficiency of a critical path 190, in accordance with an embodiment. The compiler 16 or other computer processing device may determine the kernels called by host program 20 and estimate the data path for each kernel (block 202). The execution time of each kernel may be calculated (block 204) by determining the data path parallelism, or number of parallel overlapping threads, and the cycles per thread for each kernel. Knowing the execution time for each kernel, the execution times for each kernel in the call path may be summed to determine the critical path (block 206). For example, in the example of FIG. 11, one call path timing would be calculated by summing the execution times for kernels 1, 2, 4, and 6. Another call path timing would be calculated by summing the execution times for kernels 1, 3, 4, and 6. Yet another call path timing would be calculated by summing the execution times for kernels 1, 3, 5, and 6. The call path with the largest timing (e.g., the path with kernels 1, 3, 5, and 6 in our example) would be determined to be the critical path. It is important to note that while the current example does not illustrate a looped call path, timings for such paths may still be calculated by obtaining profiling information to understand a number of times the loop may occur, thus adding the timing of the kernels in the loop to the timing summation an appropriate number of times. Once the critical path 190 is determined, any kernel on the critical path 190 (e.g., kernel 1, 3, 5, and/or 6) may be selected for copying (block 208). As discussed above, by duplicating a kernel, the throughput may be increased. By increasing the throughput on the critical path, the efficiency of the overall system may be increased. The compiler 16 may evaluate whether implementing an additional copy of the selected kernel would be beneficial (block 210). For example, the compiler 16 may determine the amount of resources necessary to implement a new copy of the selected kernel as well as the efficiency gain by implementing the new copy of the selected kernel and decide whether the new copy should be implemented. If the new copy should be implemented, the kernel is copied (block 212) and the kernel selection (block 208) is repeated, selecting either the same kernel that was copied in block 212 or a different kernel on the critical path 190. If, however, the compiler 16 determines that it is not beneficial to implement a copy of the selected kernel, the compiler 16 may determine whether there is another kernel that may be copied (block 214). If there is another kernel that may be copied, the kernel selection (block 208) is repeated, selecting a different kernel. The process 200 may continue until certain bypass metrics are met or when no other kernels are on the critical path 190. For example, when no further kernels on the critical path 190 are available to be copied, the process 200 is ended (block 216). Further, bypass metrics such as: exceeding a pre-determined number of kernel copy iterations, the exhaustion of IC resources beyond a threshold value, or determining that throughput metrics have not increased for a certain number of iterations may cause the process 200 to end (block 216).

Figure 13:
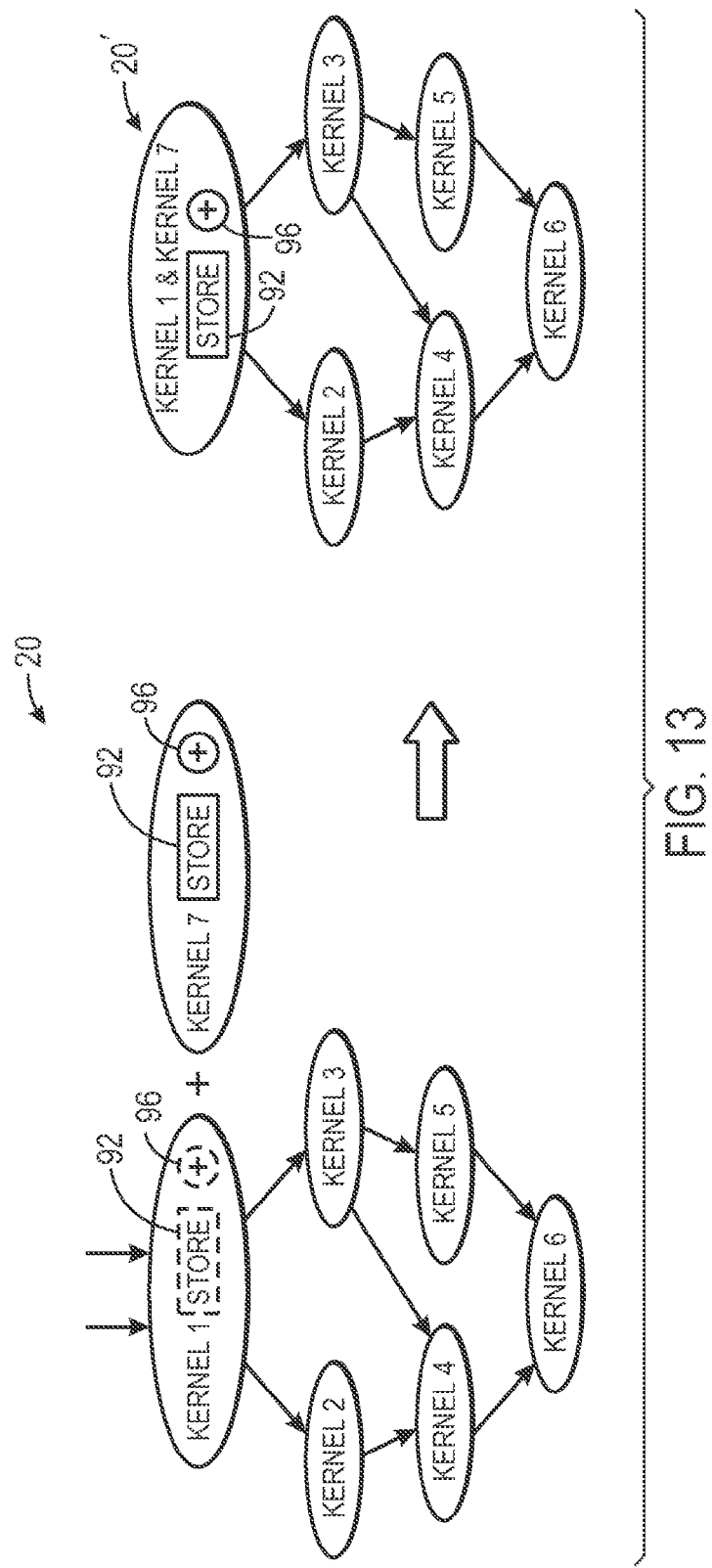
FIG. 13 is an exemplary block diagram illustrating a new kernel created through use of unused functional unit resources defined an existing kernel.

When adding new kernels to the host program 20, it may be beneficial to determine whether the new kernel can fit within existing kernels. For example, FIG. 13 illustrates an exemplary scenario where a new kernel, kernel 7 is added to the host program 20. When the compiler 16 determines that a new kernel should be added, the compiler 16 may detect whether the functional units of kernel 8 may be found in an already existing kernel. For example, if one kernel has unused functional units that are the functional units utilized in the new kernel, the existing kernel may be modified to implement the new kernel functionalities. For example, if kernel 7 consists of a store functional unit 92 and an add functional unit 96, the compiler 16 may look for unused store functional units 92 and add functional units 96. As illustrated in FIG. 13, kernel 1 may include an unused store functional unit 92 and an unused functional unit 96. Because an existing kernel includes the unused functional units necessary to implement kernel 7, kernel 1 may be modified to also perform the functions of kernel 7, as illustrated in resultant host program 20'.

Figure 14:
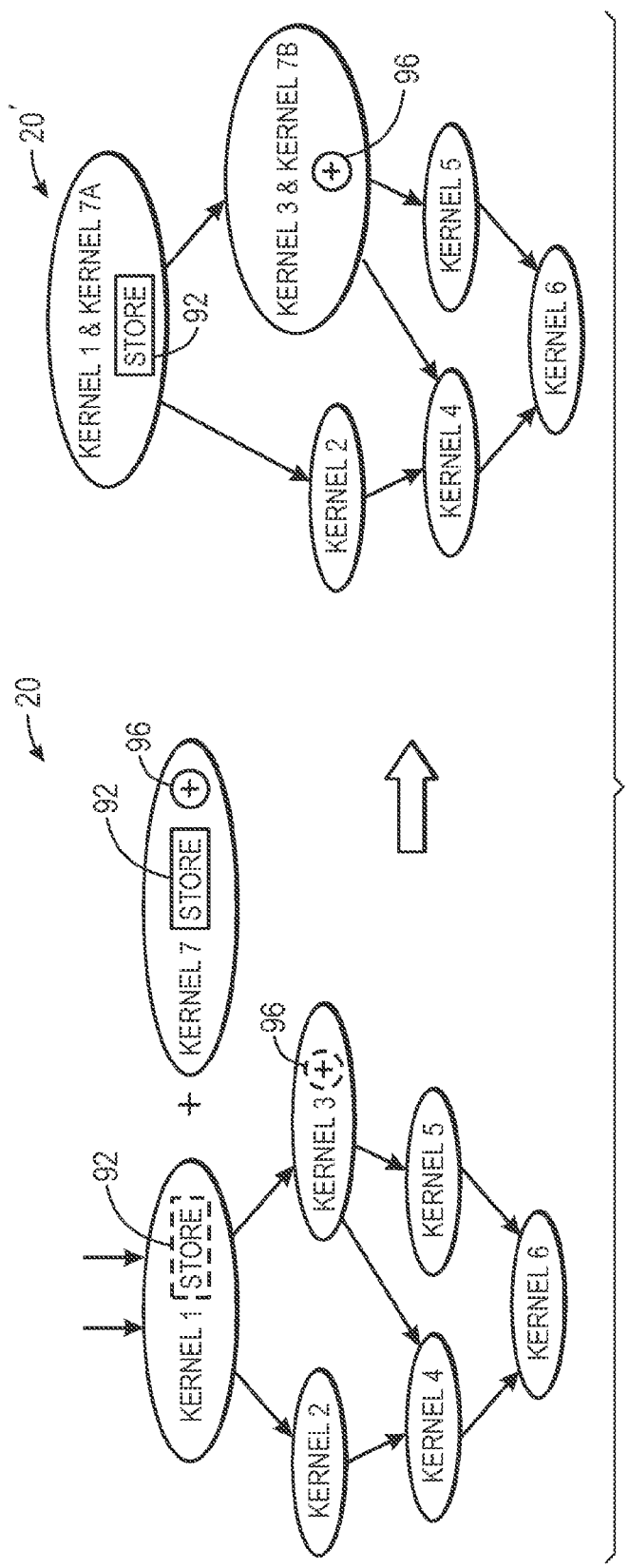
FIG. 14 is an exemplary block diagram illustrating a new kernel created through use of unused functional unit resources defined in multiple existing kernels.

In some embodiments, the compiler 16 may detect unused functional units across multiple kernels and may utilize the unused functional units to generate new kernels. For example, FIG. 14 provides one example of kernel 7's functionality being implemented in part on kernel 1 and in part on kernel 3.

As discussed above with regards to FIG. 13, kernel 7 utilizes a store functional unit 92 and an addition functional unit 96. In the depicted example, kernel 1 includes an unused store functional unit 92 and kernel 3 includes an unused addition functional unit 96. As illustrated, the compiler 16 may modify kernels 1 and 3 to perform portions of the functionality of kernel 7 (e.g., portion A of kernel 7 in kernel 1 and portion b of kernel 7 in kernel 3). Because the new kernel's functionalities may be implemented through existing kernels, no new kernels need be generated, and thus, the compile time may be greatly decreased.

While the current example illustrates all of the functionalities of the new kernel being satisfied by unused hardware in existing kernels, in some embodiments, only a portion of functionality may be satisfied by unused functional units of the existing kernels, thus causing a new kernel to be generated. Despite generation of the new kernel, it may be beneficial to utilize at least some of the unused functional units of the existing kernels. For example, such a scheme may make the hardware generation in a subsequent compile less complex and therefore less time consuming. Thus, even when the compiler 16 determines that a new kernel should be created, the compiler 16 may still utilize unused functional units of the existing kernels.

iii. Compiler Flexibility

During the two-level compile process, the design software 14 may be enabled to receive user guidance from the programmable logic designers, thus enabling the compiler 16 to alleviate excessive initial compiles based upon designer input. For example, when a new project begins, the design software 14 may prompt the programmable logic designer for an intended vertical market that the programmable logic will be designed for. A vertical market may be a business that engages in trade based on specific and specialized needs. For example, vertical market parameters provided to the design software 14 may include financial services and/or the oil & gas industry. Based upon the vertical market provided before an initial compilation, the compiler 16 or design software 14 may determine a set of useful functional units to add, regardless of whether current kernels will utilize the functional units. Such unused functional units may increase the hardware flexibility of the compiled programmable logic, helping to reduce subsequent initial compiles necessary to add additional functional units. For example, financial service vertical markets may utilize many of the trigonometry functional units as well as floating point functional units such as logarithm, square root, and double precision operational units. In contrast, oil & gas operations may frequently utilize a vastly different subset of functional units. If a designer guides the compiler 16 or the design software 14 to specifically compile the programmable logic for financial services, the compiler 16 or design software 14 may include an expansion set of functional units that is particularly geared towards financial services (e.g. the trigonometry and/or floating point functional units). In certain embodiments, one floating point functional unit may be incorporated into each kernel when there is sufficient programmable logic storage area to contain the additional functional units. Thus, as described above, the unused functional units may reduce subsequent initial compiles by enabling increased flexibility in generated kernels by providing of an expansion set of functional units to be used by newly created kernels.

However, this added flexibility may increase the amount of programmable storage space that is utilized by the programmable logic, and thus may be undesirable for some programmable logic designs. Thus, the designer may provide guidance (e.g., via an input to the design software 14) to turn off this flexibility feature, so that programmable logic space is conserved. For example, when a programmable logic design is more or less complete, with relatively little change of substantial future modifications, the designer may desire to reduce the storage area of the individual kernels, and instead replicate kernels, as discussed above, to increase throughput and, ultimately, the performance of the entire programmable logic design. Thus, by enabling the designer to turn off the flexibility function, the design may be more accurately customized, based upon the designer's guidance.

Figure 15:
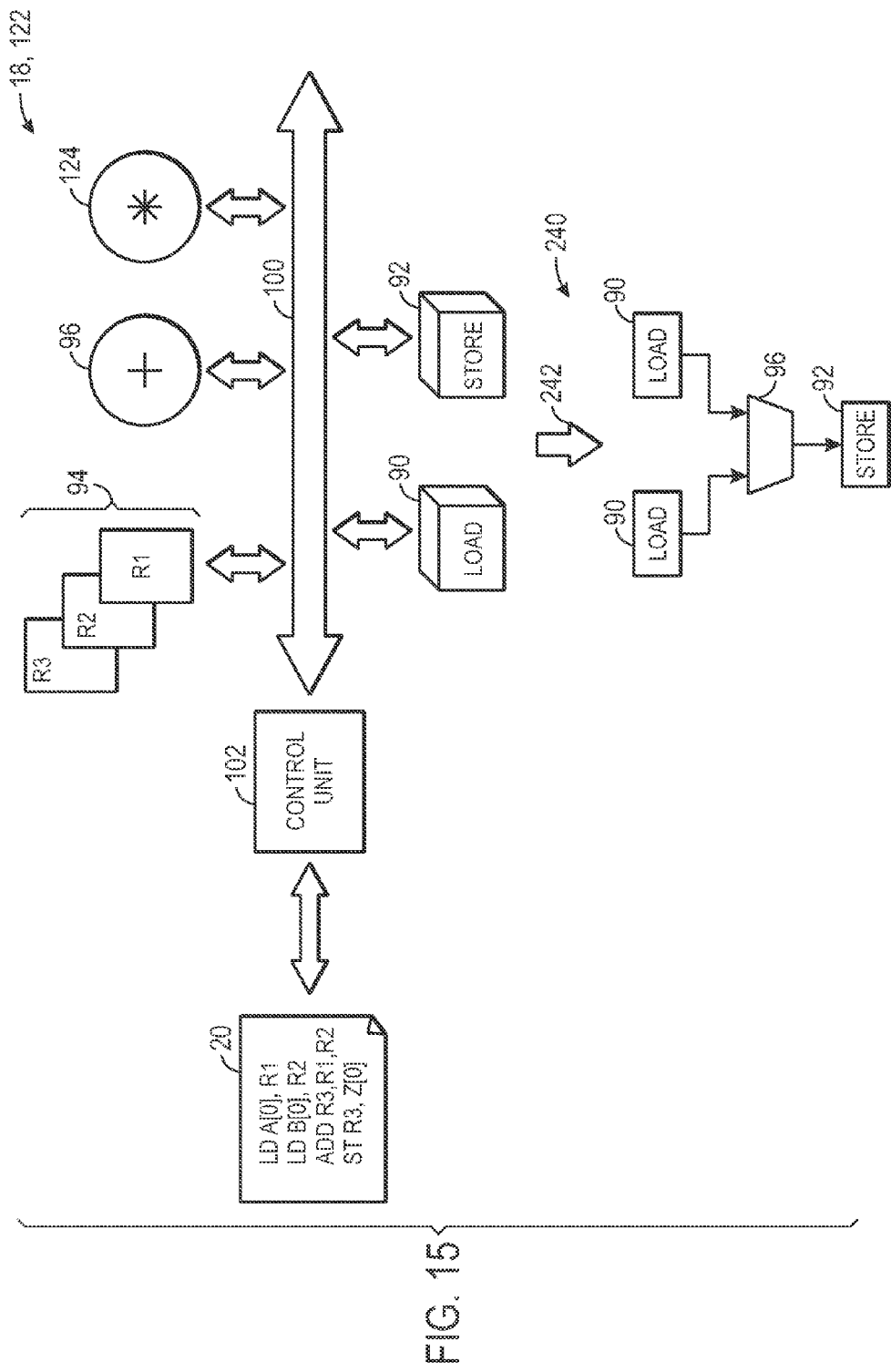
FIG. 15 is an exemplary block diagram illustrating a programmable kernel that is converted to a non-programmable hardware pipeline.

An additional compiler flexibility that may be implemented in certain embodiments, includes an ability of the designer to increase efficiency by providing guidance to selectively migrate certain kernels from a data path/programmable control implementation to a more efficient hardware pipeline implementation. Such functionality may be desired, for example, near the end of a design cycle, where efficiency may be more of a focus than functional growth. FIG. 15 illustrates an exemplary kernel implemented as an instruction set and data path that is migrated to a hardware pipeline, based upon guidance from the designer. As illustrated, the kernel may be implemented with programmability through use of the control unit 102 and the host program 20. However, when a designer desires to provide increased efficiency of the kernel, the designer may guide the compiler 16 or design software 14 to migrate the kernel to a fixed hardware pipeline, removing all programmability of the kernel. In the example of FIG. 15, the programmable kernel includes load functional units 90, store functional units 92, registers 94, an addition functional unit 96, and a multiplication functional unit 124 coupled via the data path 100. As illustrated, the host program 20 provides instructions to the control unit 102 to utilize the load unit 90, the addition functional unit 96, and the store unit 92. When the designer desires an efficiency tradeoff (e.g., increase Fmax) over a functional flexibility tradeoff (e.g., programmability), the designer may provide an indication to the compiler 16 or design software 14 such that the programmable kernel 122 may be migrated to a non-programmable hardware pipeline 240. Upon receiving this indication, the compiler 16 or design software 14 may convert the programmable kernel 122 into the non-programmable hardware pipeline 240. In the example of FIG. 15, the design software 14 has converted the programmable kernel 122 into a non-programmable hardware pipeline 240, as indicated by arrow 242. Because the host program 20 utilizes two calls to the load unit 90, a call of the addition functional unit 96, and the store unit 92, the non-programmable hardware pipeline 240 includes two load units 90, an addition functional unit 96, and a store unit 92. As may be observed from this example, the control unit 102 is not present because there are no programming instructions to be interpreted to control the non-programmable hardware pipeline 240. Further, because the multiplication unit 124 is not utilized by the host program 20, it is not incorporated into the hardware pipeline 240. By removing the programmability of the kernel, the functional flexibility of the kernel may be greatly reduced. However, such modification may result in a substantial efficiency improvement (e.g., reduced amount of programmable logic area utilized and/or increased Fmax). For example, in some embodiments, by converting the kernel of FIG. 15 into a non-programmable hardware pipeline 240 for simple addition, the Fmax performance may increase by three times that of the programmable kernel.

Figure 16:
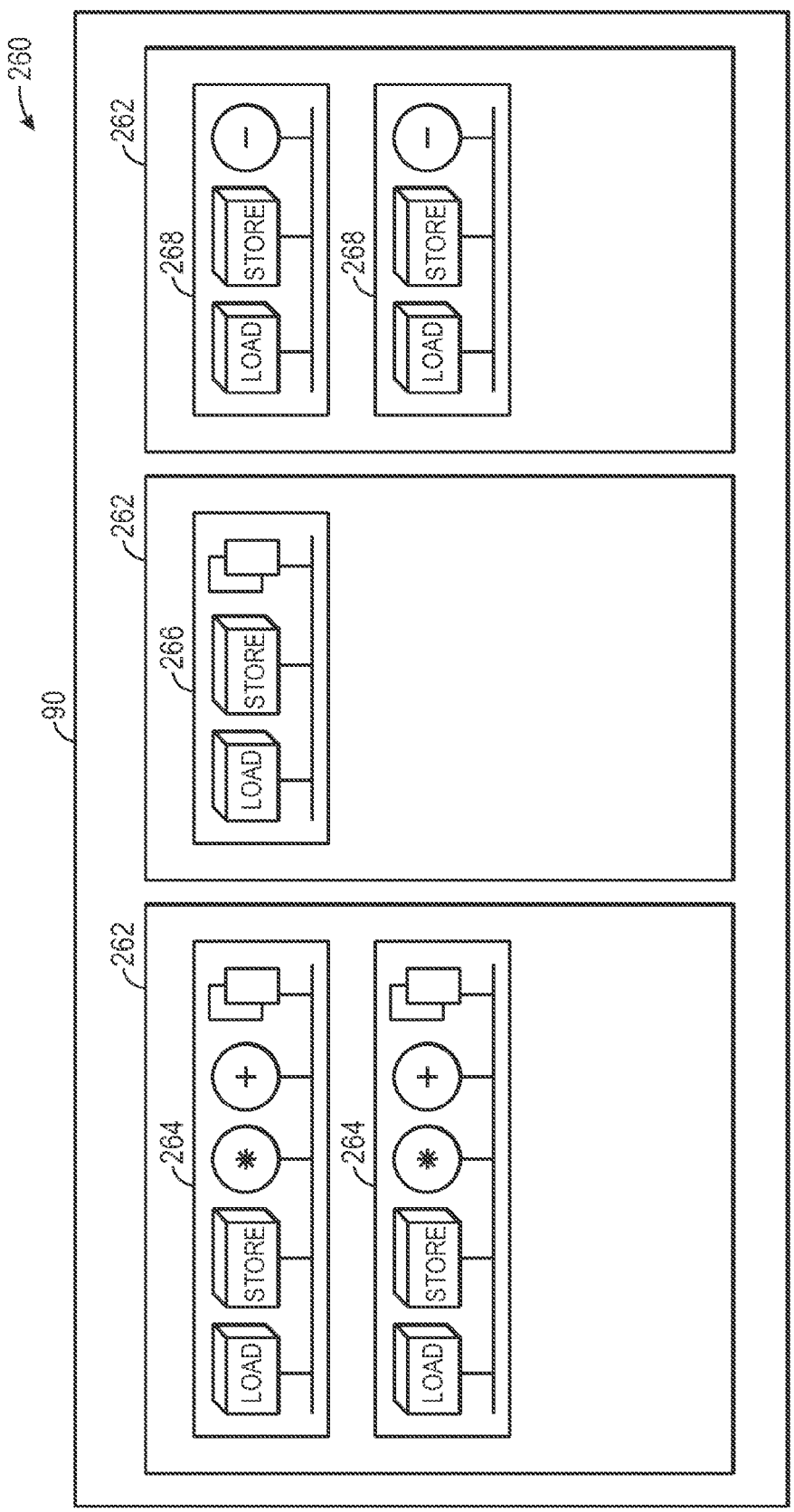
FIG. 16 is an exemplary block diagram illustrating programmable logic with design partitions, in accordance with embodiments.

Another efficiency that may be enabled by the two-level compile process is selective partitioning of kernels such that kernels of a common type may be compiled while kernels of an alternative type are not compiled. FIG. 16 illustrates exemplary programmable logic 260 with design partitions 262. The design partitions 262 may be enabled to store one or more kernels of a similar type (e.g., with common functional units). For example, kernels 264 are stored in one partition 262, kernels 266 are stored in a second partition 262, and kernels 268 are stored in a third partition 262. By storing similar typed kernels in the design partitions 262, the design software 16 may be enabled to execute initial and/or secondary compiles for only a sub-set of kernels contained within a particular design partition 262. Further, the designer may provide guidance to convert kernels within a particular partition to a non-programmable hardware pipeline for performance enhancements.

As previously discussed, the two-level compile process provided herein is useful to reduce the processing power and time to compile programmable logic for an IC, providing a more satisfactory design experience. Through guidance by the designer, the two-level compile process may be further enhanced for a particular design, enabling a compile experience that is uniquely geared towards the designer's project. Such customization may add flexibility to design, decrease compile time, and/or increase the performance of designer's program.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

What is claimed is:

1. A method, comprising:
performing, via at least one processor, an initial compile comprising:
interpreting a high level program;
generating a hardware definition comprising a kernel implementable on programmable logic of an integrated circuit (IC) based at least in part upon the high level program, by:
using a first set of instructions that define new functional units to:
determine a first one or more functional units useful for implementing the high level program;
determine a second one or more functional units that are not needed to implement the high level program, but that may be useful for implementing subsequent modifications to the high level program; and
define the hardware definition to include the first one or more functional units and the second one or more functional units; and
generate a host program comprising machine-readable implementation instructions for a control unit based upon the high level program;
using a second set of instructions that do not define new functional units to:
interpret the modifications to the high level program; and
perform a subsequent compile comprising modifying the machine-readable implementation instructions based upon the modifications, wherein the modified machine-readable implementation instructions make use of at least one of the second one or more functional units;

wherein the second one or more functional units of the hardware definition is determined based at least in part upon a throughput measurement of the hardware definition, a goal of reducing initial compiles, or a combination thereof.

2. The method of claim 1, comprising running a compiler to perform the initial compile and a programmable logic design software to perform the subsequent compile.

3. The method of claim 2, adjusting, via the compiler, a number of the second one or more functional units in the hardware definition based upon an amount of programmable logic area needed to implement the hardware definition, flexibility of the hardware definition to handle modifications to the host program, or a combination thereof.

4. The method of claim 2, comprising determining, via the compiler, a number of the second one or more functional units in the hardware definition based upon a balancing of a tradeoff between an amount of programmable logic area needed to implement the hardware definition and a throughput measurement of the hardware definition.

5. The method of claim 4, balancing, via the compiler, the tradeoff by utilizing the formula: a number of cycles used to execute each thread/(an area consumed by the programmable logic*a number of parallel threads).

6. The method of claim 1, comprising: determining, via the compiler, a critical path of the host program; and copying, via the compiler, a kernel on the critical path to increase throughput.

7. The method of claim 6, comprising determining, via the compiler, the critical path by:
determining a set of kernels called by the host program;
estimating a data path for each kernel in the set of kernels;
determining an execution time of each kernel; summing the execution time of each kernel along an execution path of the host program to determine a path with the largest execution time.

8. The method of claim 1, comprising implement, via the compiler, a second kernel using unused functional units of the kernel generated by the initial compile.

9. The method of claim 1, comprising:
determining, via the compiler, unused functional units in two or more kernels, and
implementing, via the compiler, a new kernel using at least a portion of the unused functional units in the two or more kernels.

10. The method of claim 1, comprising:
receiving, via the compiler, compiler flexibility information from a programmable logic designer; and
generating, via the compiler, the hardware definition based upon the compiler flexibility information.

11. The method of claim 10, comprising receiving a target vertical market for the high level program and generating the hardware definition based at least in part upon the high level program.

12. The method of claim 11, wherein the target vertical market comprises a financial services market and the at least one computer is configured to generate the hardware definition with trigonometry functional units, floating point functional units, or a combination thereof based upon the financial services market.

13. The method of claim 10, wherein the compiler flexibility information comprises an indication of a preference in tradeoff between increased throughput or a reduction in a number of subsequent initial builds.

14. The method of claim 13, comprising:
adding a programmable kernel when the preference is the reduction in a number of subsequent initial builds and adding a non-programmable hardware pipeline when the preference is the increase in throughput.

15. A system, comprising:
a compiler configured to:
interpret a high level program comprising machine-readable instructions representative of high-level functionality to be implemented on an integrated circuit (IC); and
perform an initial compile configured to define and generate a hardware definition comprising one or more kernels implementable on the IC based at least in part on the high level program, wherein the one or more kernels comprise:
a first one or more functional units useful for implementing the high level program; and
a second one or more functional units that are not needed to implement the high level program, but may be useful to implement one or more changes to the high level program; and
a programmable logic design software configured to:
detect the one or more changes to the high-level program; and
perform a subsequent compile configured to implement the one or more changes utilizing the second one or more functional units of the hardware definition without modifying the hardware definition;
wherein the compiler is configured to define the second one or more functional units and generate the hardware definition based at least in part upon balancing a tradeoff between at least two of: an amount of programmable logic area utilized for the hardware definition, a throughput measurement of the hardware definition, and a likelihood that additional initial compiles will be needed based upon future changes to the high-level program.

16. The system of claim 15, wherein the programmable logic design software is configured to partition the one or more kernels into a first partition and a second partition, wherein a second initial compile or a second subsequent compile may be performed on the one or more kernels in either the first partition or the second partition without affecting the kernels in alternative partition.

17. A tangible, non-transitory, computer-readable medium, comprising:
a first set of machine-readable instructions that define new functional units to:
interpret a high level program comprising machine-readable instructions representative of high-level functionality to be implemented on an integrated circuit (IC); and
perform an initial compile configured to define and generate a hardware definition comprising a kernel implementable on the IC based at least in part on the high level program, wherein the kernel comprises a first one or more functional units to implement the high level program and a second one or more functional units not needed to implement the high-level program, but that may be useful to implement one or more changes to the high-level program;
detect the one or more changes to the high-level program; and
a second set of machine-readable instructions that do not define new functional units to:
perform a subsequent compile configured to implement the one or more changes utilizing at least one of second one or more functional units of the hardware definition without modifying the hardware definition;
size the hardware definition based upon balancing a tradeoff between an amount of programmable logic area utilized for the hardware definition and a likelihood that additional initial compiles will be needed based upon future changes to the high-level program, by:
duplicating at least a portion of a kernel of a system to increase throughput,
modifying a programmable hardware definition into a non-programmable hardware pipeline to increase efficiency of the hardware definition, obtaining compiler flexibility information from a programmable logic designer and defining the hardware definition based upon the compiler flexibility information, or a combination thereof.

18. The tangible, non-transitory, computer-readable medium of claim 17, wherein the size of the hardware definition is controlled by the compiler through modifying a number of functional units in the hardware definition.

19. The tangible, non-transitory, computer-readable medium of claim 17, wherein the compiler is configured to duplicate at least one kernel on a critical path of a programmable logic implementation to increase throughput.

20. The tangible, non-transitory, computer-readable medium of claim 17, wherein the compiler flexibility information comprises: an indication to:
generate a non-programmable hardware pipeline for a kernel,
partition one or more kernels into a partition,
alleviate a number of initial compiles,
reduce an amount of programmable logic area needed for the hardware definition, or a combination thereof;
wherein the system is configured to:
partition one or more kernels into partitions when there is an indication to partition one or more kernels into a partition,
increase a number of functional units in the kernel when there is an indication to alleviate the number of initial compiles, and
decrease a number of functional units in the kernel when there is an indication to reduce an amount of programmable logic area needed for the hardware definition.

* * * * *